(12) United States Patent
Waltari

(10) Patent No.: US 9,098,072 B1
(45) Date of Patent: Aug. 4, 2015

(54) TRAVELING PULSE WAVE QUANTIZER

(71) Applicant: IQ-Analog Corporation, San Diego, CA (US)

(72) Inventor: Mikko Waltari, Escondido, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/681,206

(22) Filed: Apr. 8, 2015

Related U.S. Application Data

(63) Continuation-in-part of application No. 14/656,880, filed on Mar. 13, 2015, which is a continuation of application No. 14/537,587, filed on Nov. 10, 2014, now Pat. No. 9,007,243, which is a continuation-in-part of application No. 14/531,371, filed on Nov. 3, 2014, now Pat. No. 9,030,340, which is a continuation-in-part of application No.

(Continued)

(51) Int. Cl.
| | |
|---|---|
| *H03M 1/10* | (2006.01) |
| *G04F 10/00* | (2006.01) |
| *H03M 1/12* | (2006.01) |
| *H03M 1/50* | (2006.01) |
| *H03M 1/60* | (2006.01) |

(52) U.S. Cl.
CPC .............. *G04F 10/005* (2013.01); *H03M 1/122* (2013.01); *H03M 1/1295* (2013.01); *H03M 1/50* (2013.01); *H03M 1/502* (2013.01); *H03M 1/60* (2013.01)

(58) Field of Classification Search
CPC ......... H03M 1/50; H03M 1/502; H03M 1/60; G04F 10/005
USPC .................................................. 341/157, 166
See application file for complete search history.

(56) References Cited

U.S. PATENT DOCUMENTS

| | | | |
|---|---|---|---|
| 5,703,838 A | 12/1997 | Gorbics et al. | |
| 7,501,973 B2 | 3/2009 | Choi et al. | |
| 7,522,084 B2 | 4/2009 | Huang et al. | |
| 7,564,284 B2 * | 7/2009 | Henzler et al. | 327/261 |
| 7,667,633 B2 | 2/2010 | Choi et al. | |
| 7,782,104 B2 | 8/2010 | Madoglio et al. | |
| 7,782,242 B2 | 8/2010 | Rivoir | |
| 7,804,290 B2 * | 9/2010 | Henzler et al. | 324/76.82 |
| 7,884,751 B2 * | 2/2011 | Shimizu et al. | 341/166 |
| 7,893,861 B2 * | 2/2011 | Bulzacchelli et al. | 341/166 |
| 7,999,707 B2 | 8/2011 | Park et al. | |
| 8,064,561 B2 * | 11/2011 | Henzler | 375/371 |

(Continued)

OTHER PUBLICATIONS

Jovanovic et al., "Vernire's delay Line Time-to-Digital Converter", Appl Math Inform and Mech, vol. 1, 1(2009), 11-20.

(Continued)

*Primary Examiner* — Khai M Nguyen
(74) *Attorney, Agent, or Firm* — Law Office of Gerald Maliszewski; Gerald Maliszewski

(57) ABSTRACT

A Traveling Pulse Wave Quantization method is provided for converting a time sensitive signal to a digital value. A first stop signal is delayed by a first time delay, a first plurality of times, to create a delayed first stop signal. A clock signal is delayed by a second time delay, a first plurality of times, to create a delayed clock signal first period. Each second time delay is associated with a corresponding first time delay, and the second time delay is greater than the first time delay. When the delayed first stop signal occurs before the delayed clock signal first period, a count of the delays is stopped and converted into a digital or thermometer value. An accurate resampled value is provided regardless of the duration in delay between the first stop signal and a second stop signal that is accepted after the first stop signal.

20 Claims, 9 Drawing Sheets

Related U.S. Application Data

14/511,206, filed on Oct. 10, 2014, now Pat. No. 8,917,125, which is a continuation-in-part of application No. 14/081,568, filed on Nov. 15, 2013, now Pat. No. 8,878,577, which is a continuation-in-part of application No. 13/603,495, filed on Sep. 5, 2012, now Pat. No. 8,654,000, and application No. 14/537,587, which is a continuation-in-part of application No. 14/158,299, filed on Jan. 17, 2014, now Pat. No. 9,019,137, and a continuation-in-part of application No. 14/489,582, filed on Sep. 18, 2014, now Pat. No. 8,928,513, application No. 14/681,206, filed on Apr. 8, 2015, which is a continuation-in-part of application No. 14/531,371, filed on Nov. 3, 2014, now Pat. No. 9,030,340, which is a continuation-in-part of application No. 14/511,206, filed on Oct. 10, 2014, now Pat. No. 8,917,125, which is a continuation-in-part of application No. 14/081,568, filed on Nov. 15, 2013, now Pat. No. 8,878,577, which is a continuation-in-part of application No. 13/603,495, filed on Sep. 5, 2012, now Pat. No. 8,654,000.

(56) References Cited

U.S. PATENT DOCUMENTS

| | | | |
|---|---|---|---|
| 8,138,956 B2 | 3/2012 | Hsu et al. | |
| 8,138,958 B2 * | 3/2012 | Dai et al. | 341/155 |
| 8,212,547 B2 * | 7/2012 | Tiwari et al. | 324/76.12 |
| 8,222,607 B2 * | 7/2012 | Mann | 250/362 |
| 8,421,661 B1 | 4/2013 | Jee et al. | |
| 8,471,736 B1 | 6/2013 | Booth et al. | |
| 8,471,754 B2 * | 6/2013 | Yamamoto et al. | 341/166 |
| 8,976,053 B1 | 3/2015 | Zhang et al. | |
| 2012/0229185 A1 | 9/2012 | Rieubon | |

OTHER PUBLICATIONS

"Smart Pavement Monitoring System", Chap. 3, Development of Wireless Communication and Data Upload Protocol, 29 pages.

* cited by examiner

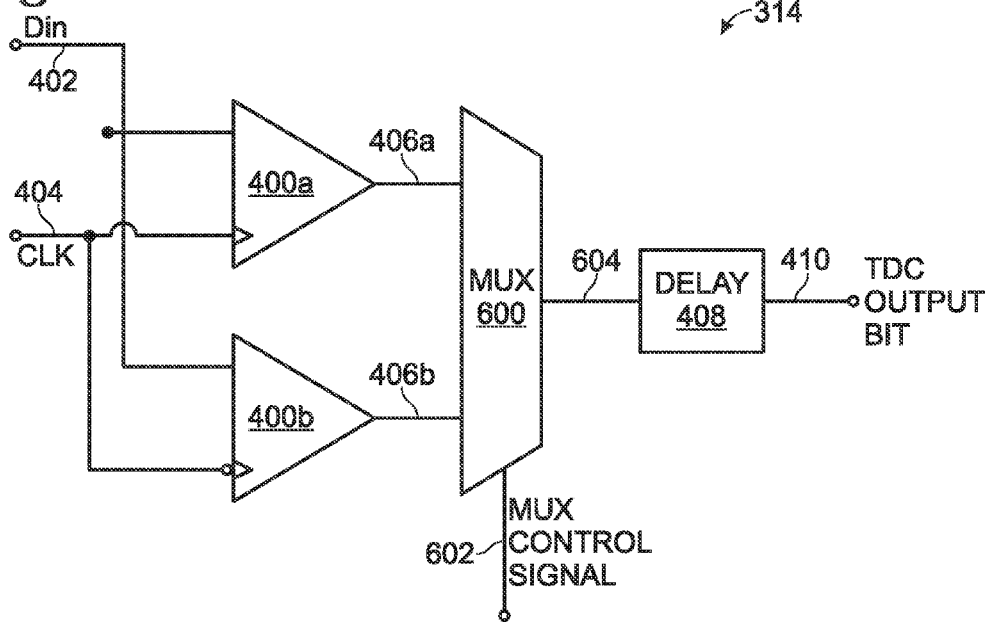
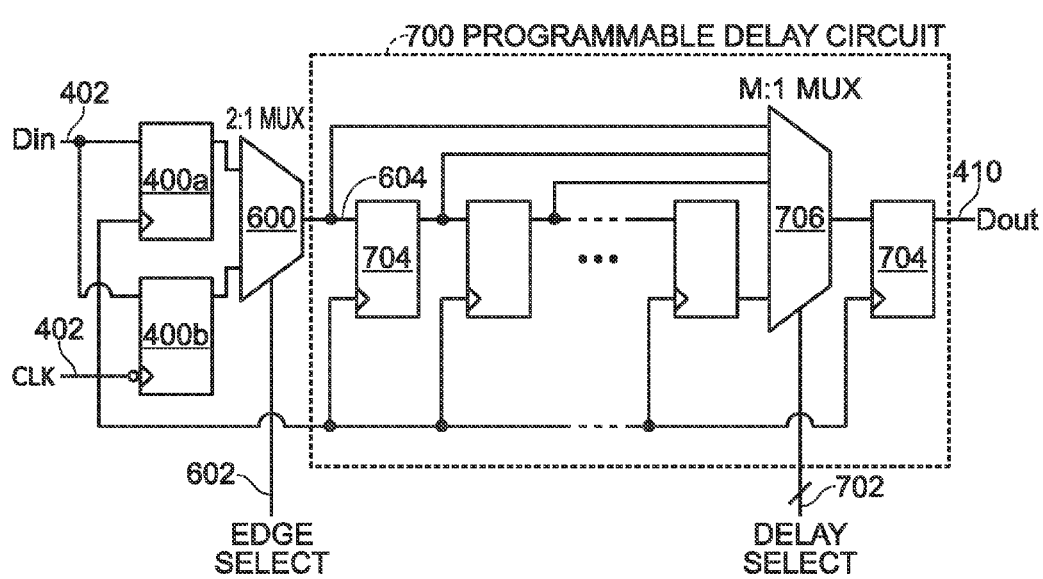

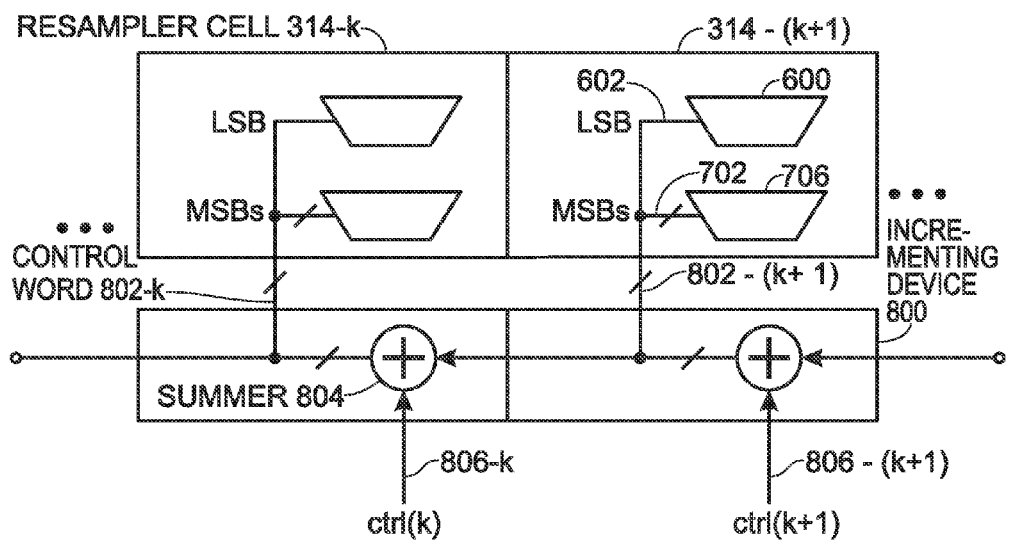
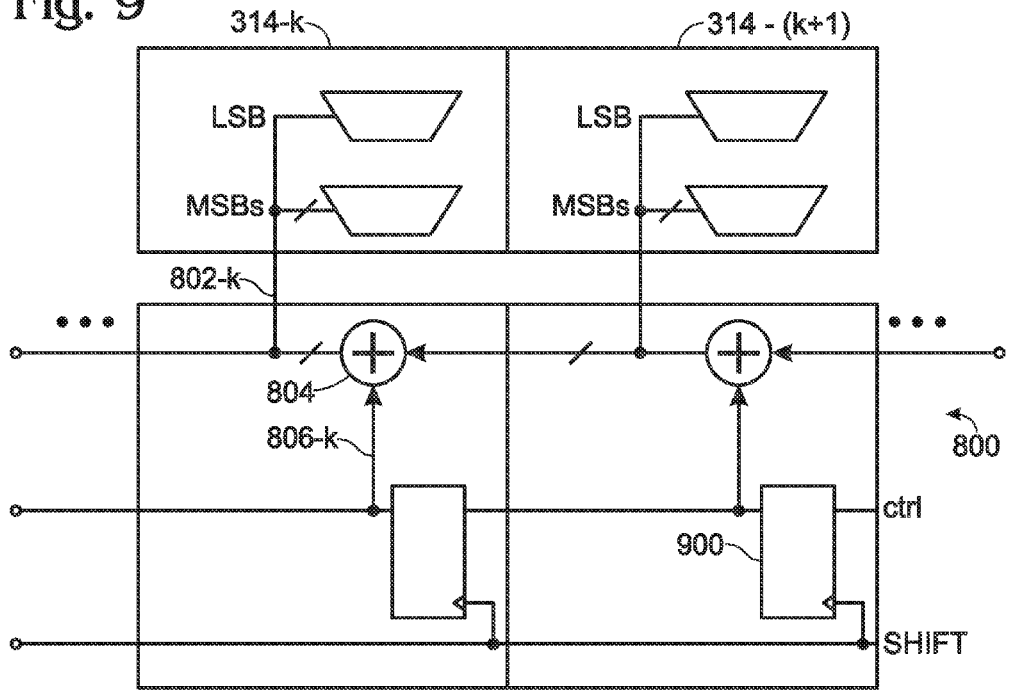

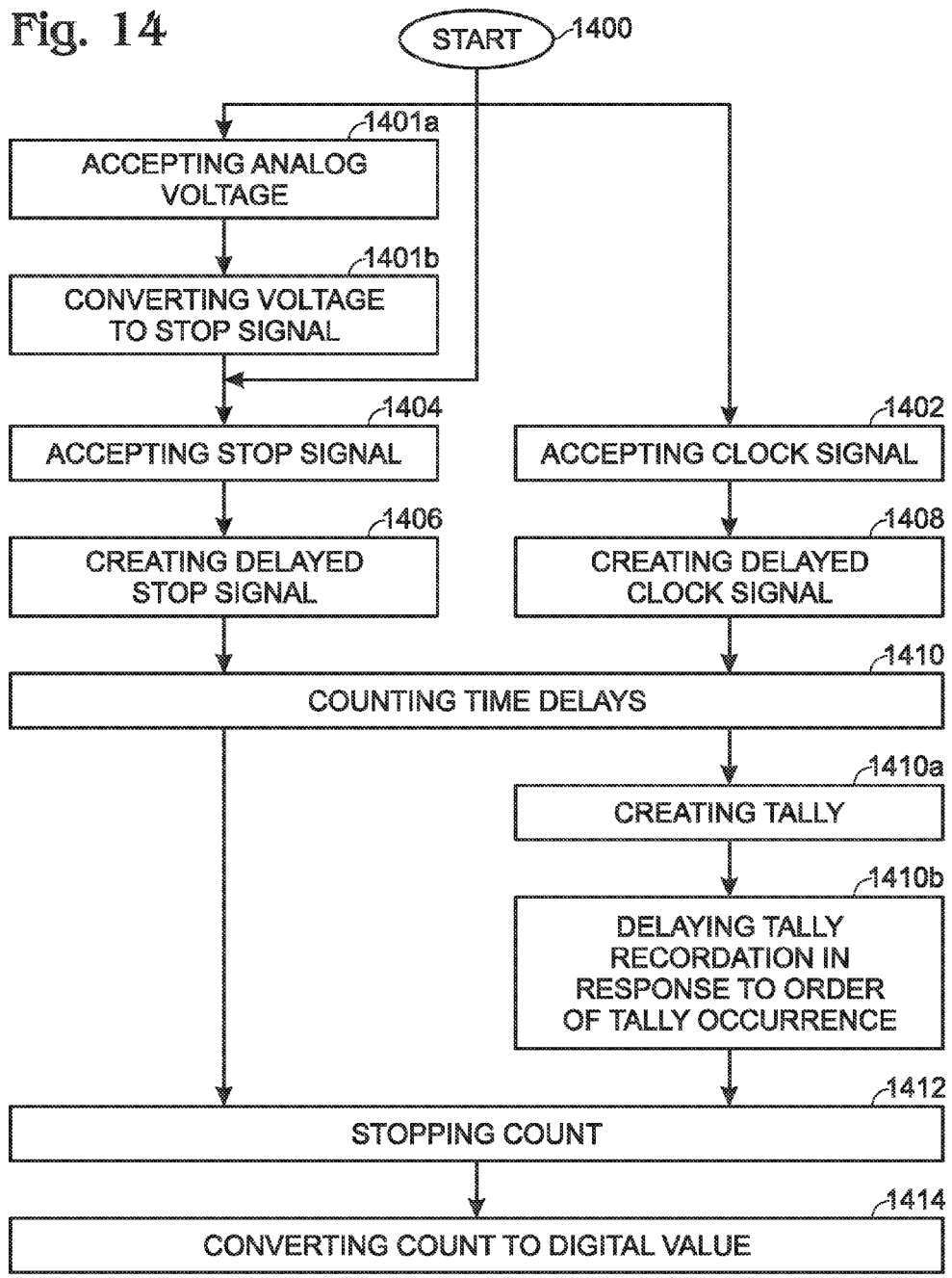

TRAVELING PULSE WAVE QUANTIZER

BACKGROUND OF THE INVENTION

1. Field of the Invention

This invention generally relates to electronic circuitry and, more particularly, to a Traveling Pulse Wave Quantizer.

2. Description of the Related Art

FIGS. 1A and 1B are, respectively, a schematic diagram of a Vernier delay line (VDL) based time-to-digital converter (TDC), and an associated timing diagram (prior art). A VDL TDC is a popular choice for applications that require fine time resolution. It is based on the use of two parallel tapped delay lines, one fed with reference (start) pulses and the other line with signal (stop) pulses. The fast delay line that is used for the signal pulses is constructed or tuned to be slightly faster than the reference slow delay line. The edge of a start (reference) pulse, occurring before the stop signal pulse edge, is used as a reference, travelling along the slow delay line. The stop signal edge arrives later and propagates along the fast delay line, eventually catching up with the start (reference) edge travelling on the parallel slow delay line. The location along the delay line where the pulses coincide corresponds to the time difference between the start (reference) pulse edge and the stop signal edge. As the time resolution is set by the delta of two unit delays, as opposed to a full unit delay, it can be made almost arbitrarily fine.

The location of the edge crossing is captured by a sampler constructed from a bank of D-flip flops. The flip flops are clocked by the pulses from the reference (slow) delay line taps and the D-inputs are connected to the corresponding taps in the signal (fast) delay line. Once the two edges have passed through the entire delay line(s), the digital value corresponding to the delay difference is available as a thermometer coded digital word at the output of the sampler flip-flop bank. This signal is captured by the system clock and converted to a binary format. Alternatively the thermometer-to-binary conversion can be performed before capturing the signal with the system clock. Either way, the throughput of the VDL TDC is limited by the total length (in time) of the delay line as the stop signal and start (reference) edges need to pass through the entire delay line before the next pair of edges can be fed in. If a new stop pulse is fed in before the previous thermometer coded output is captured, the result is a corrupted digital signal. For proper operation the following condition has to be met: Tclk>Tdel, where Tclk is the clock period and Tdel the combined delay of all the delay elements in the slow delay line.

It would be advantageous if a VDL TDC could be structured so that more than one start pulse could be processed simultaneously.

SUMMARY OF THE INVENTION

Disclosed herein is a Traveling Pulse Wave Quantizer, which may also be referred to as a pipelined Vernier delay line (VDL) time-to-digital (TDC), operating at rates where the clock period (Tclk) is less than the combined delay of all the delay elements (Tdel) in the slow delay line (Tclk<Tdel). The TPWQ permits more than one pair of pulses to travel simultaneously along the delay lines without corrupting one another. Signal corruption conventionally occurs in the capturing of the thermometer coded sampler output with the system clock. This is because the code forms bit-by-bit over several start pulse periods. The TPWQ disclosed herein adds a new block called a resampler to the output of the sampler. The resampler solves two problems: it prevents metastability when the data bit changes close to capturing clock edge, and it correctly realigns the different data bits that belong to one signal sample.

Accordingly, a method is provided for converting a time sensitive signal to a digital value. The method first accepts a clock signal and then accepts a first stop signal at a non-predetermined time after the acceptance of a first period of the clock signal. The first stop signal is delayed by a first time delay, a first plurality of times, to create a delayed first stop signal. The clock signal is delayed by a second time delay, a first plurality of times, to create a delayed clock signal first period. Each second time delay is associated with a corresponding first time delay, and the second time delay is greater than the first time delay. The method counts the number of first time delays. When the delayed first stop signal occurs before the delayed clock signal first period, the count is stopped and converted into a digital or thermometer value. An accurate (non-corrupted) value is provided regardless of the duration in delay between the first stop signal and a second stop signal that is accepted after the first stop signal. Alternatively stated, the number of first time delays associated with the first stop signal can be counted while simultaneously counting the number of first time delays associated with the second stop signal. More explicitly, the number of first time delays is counted by creating a tally of first time delays, and delaying the recordation of each tally in response to the order in which the tally occurs. An initial tally is assigned a longer delay than a subsequent tally.

Additional details of the above-described method, a Traveling Pulse Wave Quantizer circuit, and a Traveling Pulse Wave Quantizer analog-to-digital converter (ADC) are provided below.

BRIEF DESCRIPTION OF THE DRAWINGS

FIG. 6 is a schematic block diagram depicting a third exemplary sampler cell.

FIG. 7 is a schematic block diagram depicting a fourth exemplary resampler cell.

FIG. 8 is a schematic block diagram of an exemplary incrementing device.

FIG. 9 is a schematic block diagram of a second exemplary incrementing device.

FIG. 14 is a flowchart illustrating a method for converting a time sensitive signal to a digital value.

DETAILED DESCRIPTION

Figure 1A:
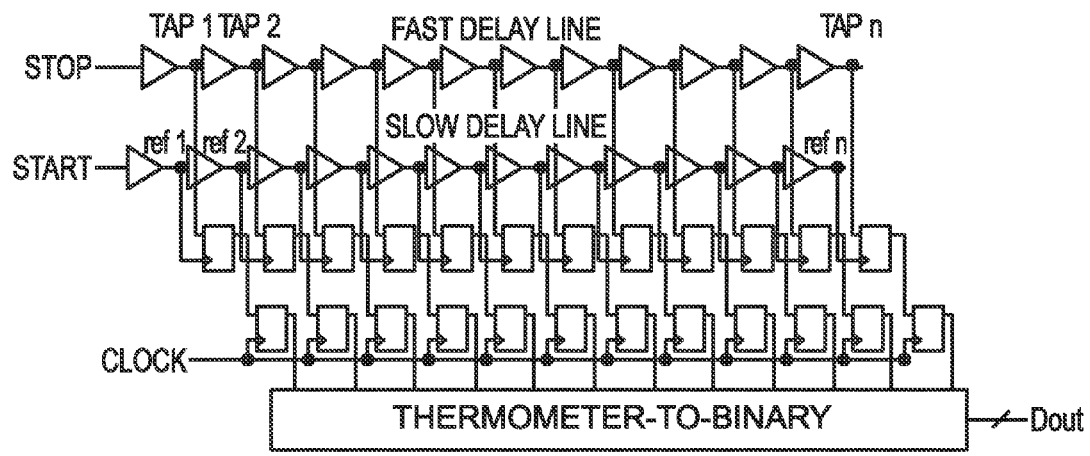
FIGS. 1A and 1B are, respectively, a schematic diagram of a Vernier delay line (VIM) based time-to-digital converter (TDC), and an associated timing diagram (prior art).
Figure 1B:
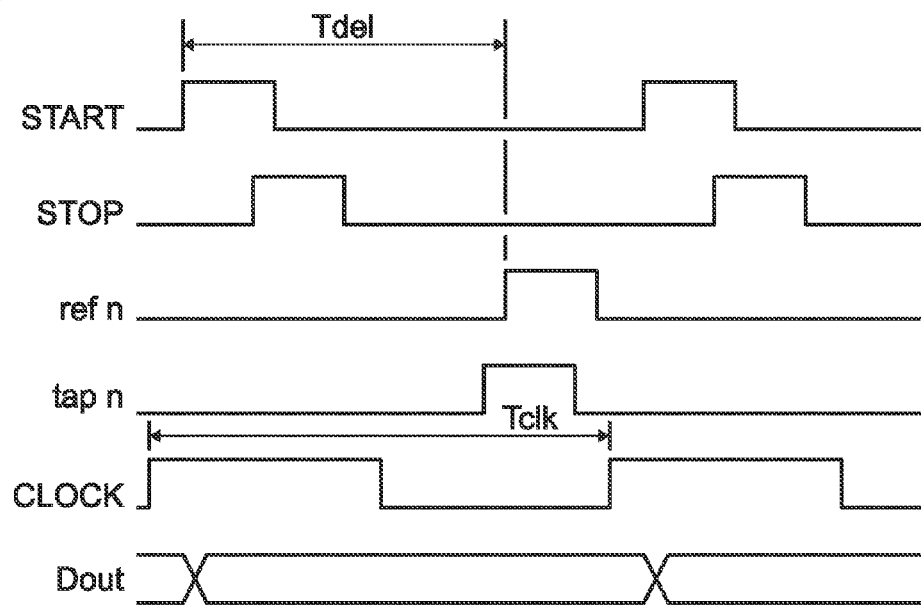
Figure 2:
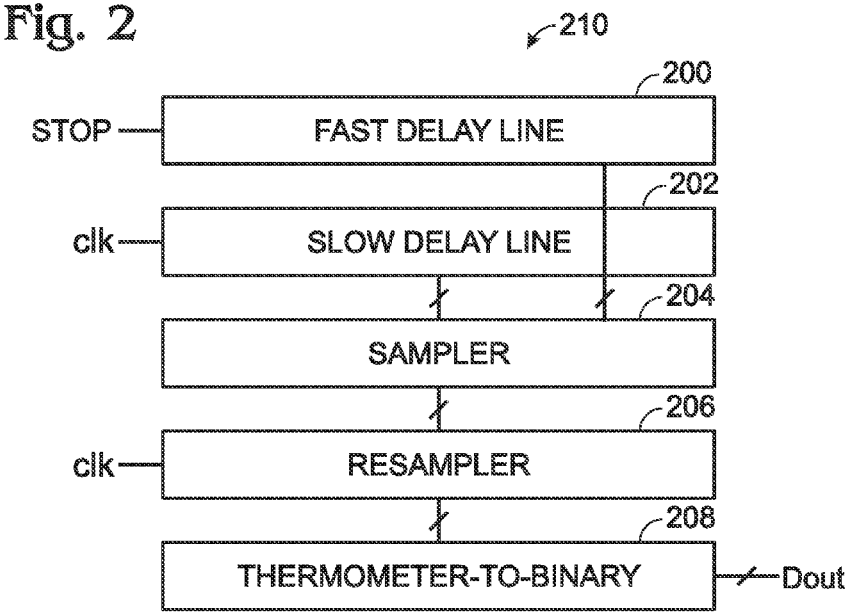
FIG. 2 is a block diagram of a Traveling Pulse Wave Quantizer (TPWQ).

FIG. 2 is a block diagram of a Traveling Pulse Wave Quantizer (TPWQ). The TPWQ 210, which may also be referred to as a pipelined Vernier delay line time-to-digital converter, comprises a fast delay line 200 to accept a stop pulse and slow delay line 202 to accept a clock (CLK) pulse. As described in greater detail below, measurements from the fast delay line 200 and slow delay line 202 are fed into sampler 204. To this point, the circuitry is similar to the conventional design depicted in FIG. 1A. A resampler 206 accepts the clock signal and information from the sampler 204. Optionally, the results from the resampler 206 are fed to a thermometer-to-binary block 208, which provides a digital output (Dout).

Figure 3A:
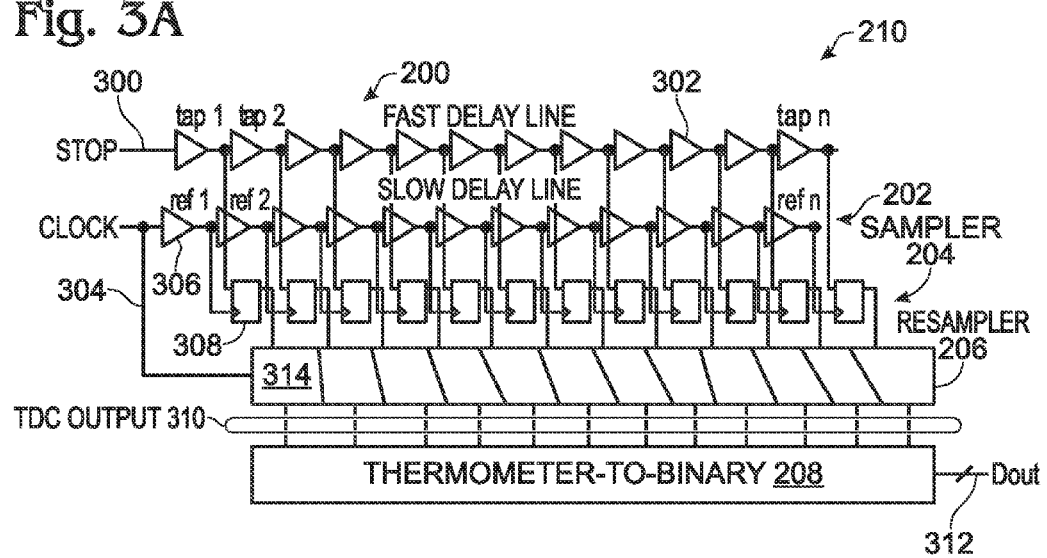
FIGS. 3A and 3B are, respectively, a schematic block diagram and associated timing diagram, describing the TPWQ block diagram of FIG. 2 is greater detail.
Figure 3B:
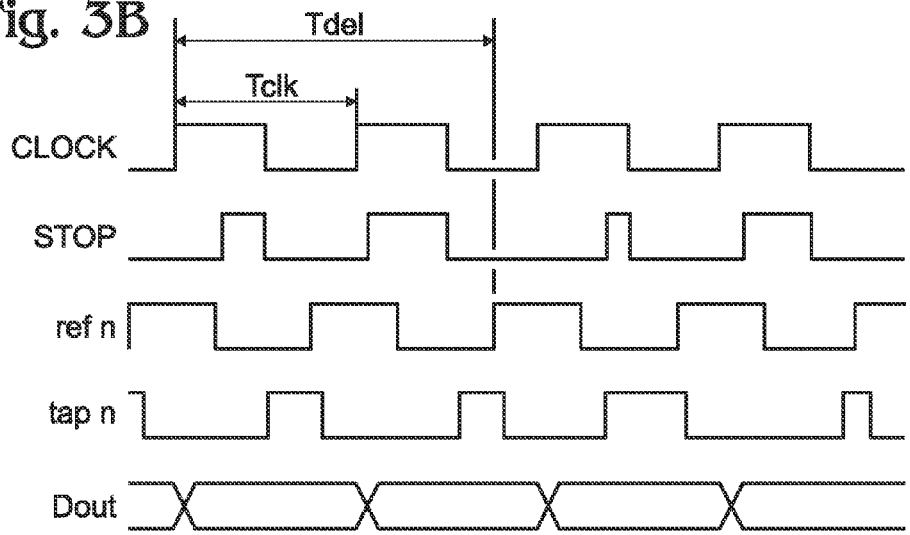

FIGS. 3A and 3B are, respectively, a schematic block diagram and associated timing diagram, describing the TRWQ block diagram of FIG. 2 is greater detail. The fast delay line 200 has an input on line 300 to accept a first stop signal followed (in time) by a second stop signal. The fast delay line 200 comprises a first plurality (n) of first delay elements or taps 302 connected in series with an output between each first delay element. Each first delay element 302 has a first time delay. In the example shown, n=12, but it should be understood that n is not limited to any particular value. Further, although the first delay element 302 is depicted as a buffer, it should be understood that it not limited to any particular type of structure, and can also be, for example, a combinational logic element or a group or combinational logic elements, a passive element such as an inductor, resistor, capacitor, a combination of passive elements, or a section of microstrip or waveguide.

The slow delay line 202 has an input on line 304 to accept the clock signal. Here it should be noted that the clock edge (e.g., rising edge) preceding the first stop signal (e.g., rising edge) is used as a reference, and may be referred to as a first clock signal or a first period of the clock signal. The slow delay line 202 comprises a first plurality of second delay elements 306 connected in series with an output between each second delay element. Each second delay element 306 has a second time delay, which is greater than the first time delay. The sampler 204 comprises a first plurality of clocked buffers 308 connected in series with a sample output between each clocked buffer. Each clocked buffer 308 has a signal input connected to the output of a corresponding first delay element 302, and a clock input connected to the output of a corresponding second delay element 306. In this example, the clocked buffer 308 is depicted as a D flip-flop, however, it such be understood that the function of edge detection can be provided by a variety of other edge detection circuits.

The resampler 206 has an input to accept the first plurality of clocked buffer outputs, and an output 310 to supply a first plurality of time-to-digital converter (TDC) output bits (e.g., n bits) representing a time delay between the first stop signal and the first period of the first clock signal. For example, the output bits may read a "0" value, starting from the left (initial) bit until the first stop signal coincides with clock signal, and thereafter supply "1" value bits. Critically, the TDC output bits represent a valid accurate delay value regardless of the duration in delay between the first stop signal and the second stop signal. One exception to this rule is if the delay between second stop signal and the first stop signal is less than the first delay associated with first delay element 302. In some aspect, a thermometer-to-binary block 208 is used to convert the resampler output 310 to a binary value (Dout) on line 312. The binary values may, for example, be values that are easier to mathematically manipulate or store.

As explained in more detail below, the resampler 206 comprises a first plurality of cells 314 ordered in an array. Each cell 314 has a signal input connected to a corresponding sample output, and a TDC output bit delayed with respect to the order of the cell in the array.

In the prior art (see FIG. 1A), all the hits are supplied simultaneously by the second hank of flip-flops (after the sampler) at the rising edge of the clock. This method works fine as long as the second stop signal does not arrive before the rising edge of the clock and before the first stop signal has traveled all the way through the whole fast delay line. If the second stop signal is sent earlier, some hits of the output are associated with the first time period to be measured and other bits with the second time period to be measured. At the boundary some of the hits may be meta-stable, without a proper logic value. The use of the resampler cells solves this problem.

Figure 4:
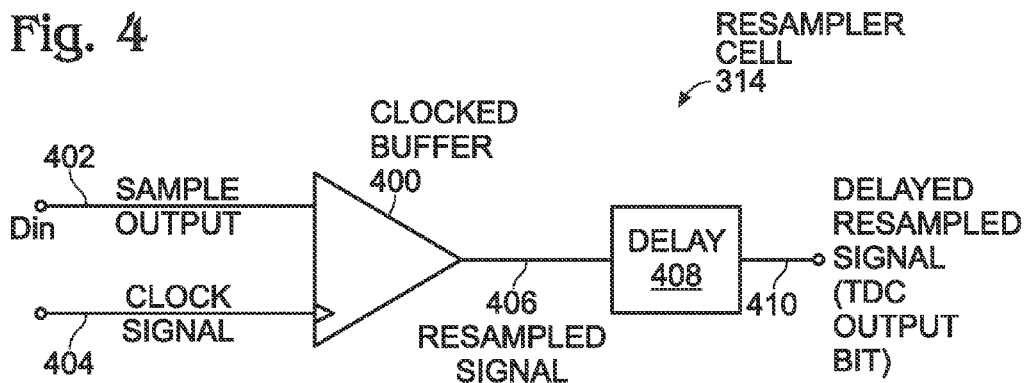
FIG. 4 is a schematic block diagram depicting a first exemplary resampler cell.

FIG. 4 is a schematic block diagram depicting a first exemplary resampler cell. In one aspect, each resampler cell 314 comprises a clocked buffer 400 having an input on line 402 connected to a corresponding sample output (Din), an input on line 404 to accept a clock signal, and an output on line 406 to supply a resampled signal. For example, the clocked buffer 400 may be a D flip-flop, but other edge detection circuitry may also be used. A delay circuit 408 has an input on line 406 to accept the resampled signal, and an output on line 410 to supply a delayed resampled signal as a TDC output bit. The clocked buffer 400 may be designed to supply a resampled signal responsive to either the positive edge or negative edge of the clock signal.

Figure 5:
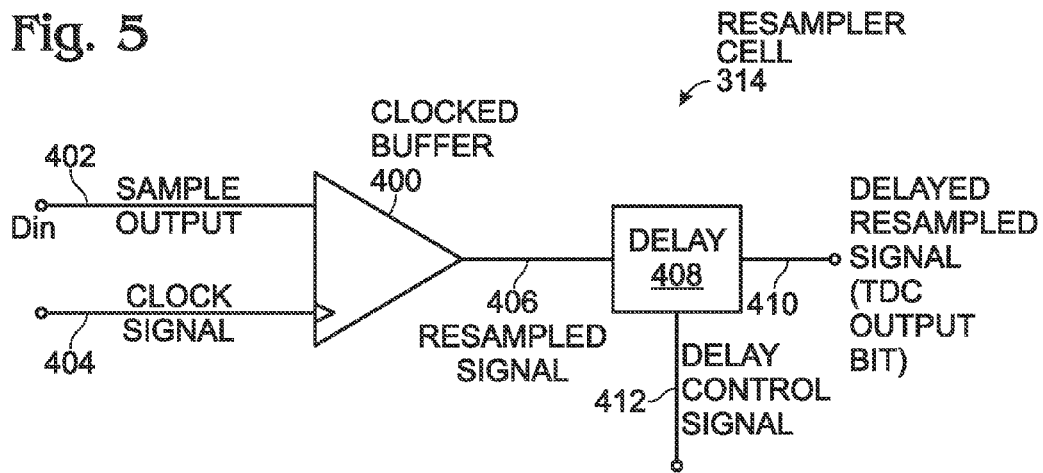
FIG. 5 is a schematic block diagram depicting a second exemplary resampler cell.

FIG. 5 is a schematic block diagram depicting a second exemplary resampler cell. In this aspect, the delay circuit 408 is a programmable delay circuit having an input on line 412 to accept a delay control signal. As a result, the TDC output hit is supplied on line 410 with a delay duration responsive to the delay control signal on line 412.

FIG. 6 is a schematic block diagram depicting a third exemplary sampler cell. In this aspect, each resampler cell 314 comprises a first clocked buffer 400a having an input connected to a corresponding sample output on line 402 (Din), an input to accept a clock signal on line 404, and an output to supply a first resampled signal 406a responsive to a positive edge of the clock signal. A second clocked buffer 400b has an input connected to the corresponding sample output on line 402, an input to accept the clock signal on line 404, and an output to supply a second resampled signal 406b responsive to a negative edge of the clock signal. A multiplexer (MUX) 600 has inputs accepting the first and second resampled signals on line 406a and 406b, respectively, a MUX control input on line 602, and an output to supply a resampled signal 604 selected in response to the MUX control signal. A delay circuit 408 has an input on line 604 to accept the selected resampled signal, and an output on line 410 to supply a delayed resampled signal as a TDC output bit.

FIG. 7 is a schematic block diagram depicting a fourth exemplary resampler cell. In this aspect, each resampler cell 314 comprises a first clocked buffer 400a, here depicted as a D flip-flop, having an input connected to a corresponding sample output on line 402 (Din), an input to accept a clock signal on line 404, and an output to supply a first resampled signal 406a responsive to a positive edge of the clock signal. A second clocked buffer 400b has an input connected to the corresponding sample output on line 402, an input to accept the clock signal on line 404, and an output to supply a second resampled signal 406b responsive to a negative edge of the clock signal. A MUX 600 has inputs accepting the first and second resampled signals on line 406a and 406b, respectively, a MUX (edge select) control input on line 602, and an output to supply a resampled signal 604 selected in response to the MUX control signal. A programmable delay circuit 700 having an input to accept a delay control (delay select) signal on line 702, and an output on line 410 to supply the TDC output bit with a delay duration responsive to the delay control signal.

Here, the programmable delay circuit 700 is enabled as a series of M connected D flip-flops 704, where M is not limited to any particular value, and an M-to-1 MUX 706. The output of MUX 706 is buffered with an additional D flip-flop. The programmable delay could be enabled using other circuit components, as would be known by one with ordinary skill in the art.

Using both positive and negative edges of the clock on line 404, the resamplers 314 are capable of capturing two versions of the thermometer code. If one clock edge falls close to the transition of the data bit, the value captured by the opposite clock edge is used. A 2:1 multiplexer 600 is used to select between the two versions. After the multiplexer 600 a programmable number of single-clock cycle delays is implemented using, for example, a chain of flip-flops 704 and a second multiplexer 706. This delay control allows alignment of the captured data bits. Once determined by using an initial calibration cycle or some other means, the multiplexer control signals are kept static. An example of MUX control values for a whole array of resampler cells is shown in Table 1 for the scenario where the clock period is 19 tap delays (delay elements) long.

TABLE 1

| Thermometer bits | Edge select | Delay select |
| --- | --- | --- |
| 1-10 | Positive | 3 |
| 11-19 | Negative | 3 |
| 20-29 | Positive | 2 |
| 30-38 | Negative | 2 |
| 39-48 | Positive | 1 |
| 49-57 | Negative | 1 |
| 58-63 | Positive | 0 |

FIG. 8 is a schematic block diagram of an exemplary incrementing device. The incrementing device 800 has a first plurality of control word outputs, each control word output corresponding to a resampler cell. Shown are resampler cells 314-$k$ and 314-($k$+1) accepting, respectively, control words on lines 802-$k$ and 802-($k$+1). The control words include a MUX control signal on line 602 of each resampler cell, here represented as a single least significant bit (LSB), which periodically changes in response to the order of the cell in the array. For example, resampler cell 314-$k$ may be enabled to pass the resampled signal clocked on the rising edge, while resampler cell 314-($k$+1) may be enabled to pass the resampled signal clocked on the falling edge. The control words also supply a delay control signal on line 702 of each resampler cell, here represented as a plurality of most significant bits (MSBs), which changes the delay duration in responsive to the order of the cell in the array. For example, and briefly referring to FIG. 7, resampler cell 314-$k$ may be enabled with a delay of two clocked buffers, while resampler cell 314-($k$+1) may be enabled with a delay of a single clocked buffer.

In one aspect as shown, the incrementing device 800 comprises a first plurality of summers 804 connected in series. Each summer 804 has an output connected to supply a control word to corresponding resampler cell and a first input to accept a control word from an adjacent summer. For example, the summer 804 supplying the control word on line 802-$k$ accepts an input on line 802-($k$+1). Each summer 804 also has a second input to accept an augmentation term modifying be control word accepted at the first input. As shown, the summer 804 supplying the control word on line 802-$k$ accepts an augmentation term (ctr($k$)) on line 806-$k$, and the summer supplying the control word on line 802-($k$+1) accepts an augmentation term (ctr($k$+1)) on line 806-($k$+1). As shown, the control word moves in a "direction" from the resampler cells associated with last delay elements (most delayed) in the fast and slow delay lines, to the resampler cells associated with the initial delay elements (least delayed), and augments the control word through addition. Alternatively but not shown, the "direction" of the control word may be reversed and the augmentation terms subtracted.

FIG. 9 is a schematic block diagram of a second exemplary incrementing device. As each resampler cell has its own unique control word with multiplexer and delay control bits, the total number of hits can become very large and pose a routing problem. One way to reduce the number of control bits is to use only one bit per cell and some logic as shown in FIG. 8. This is possible because, if properly coded, the control word values for adjacent cells may only differ by one, and thus, it is possible to generate control word values using one bit of control (e.g., augmentation) and the control word from a neighboring cell. To further alleviate the potential routing problem the one-bit control signals can be distributed by using a shift register 900, in cooperation with a control signal and a shift signal, as shown in FIG. 9.

Figure 10:
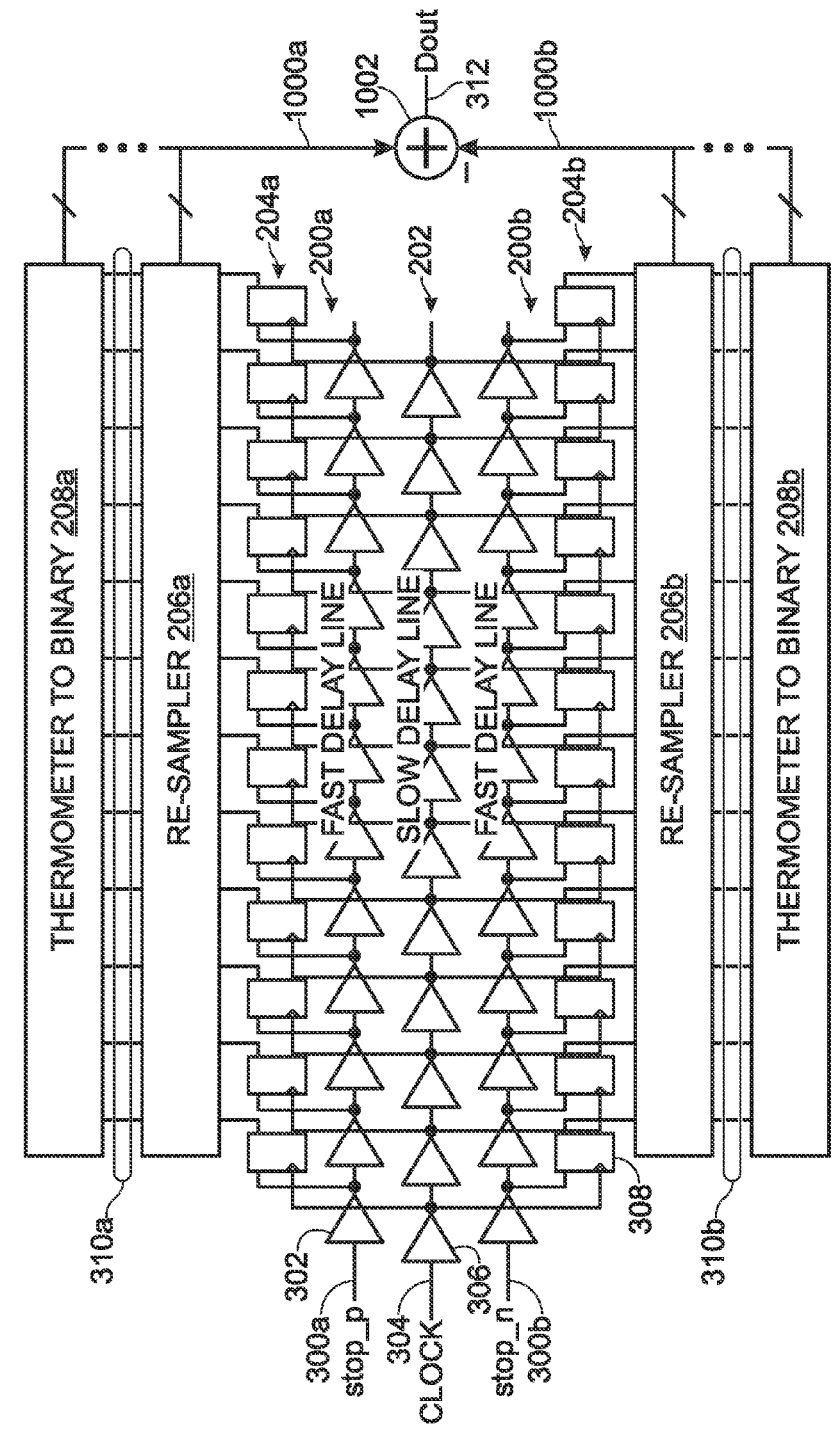
FIG. 10 is a schematic block diagram depicting a time differential version of the TPWQ.

FIG. 10 is a schematic block diagram depicting a time-differential version of the TPWQ. In this aspect, the fast delay line comprises a first fast delay 200$a$ line having an input on line 300$a$ to accept the first stop signal (stop_p), with a first plurality of first delay elements 302 connected in series. A second fast delay line 200$b$ has an input on line 300$b$ to accept a parallel first stop signal (stop_n), nominally accepted at the same time as the first stop signal on line 300$a$. The second fast delay line 200$b$ also has a first plurality of first delay elements 302 connected in series. A single slow delay line 202, with second delay line elements 306, is used, as in the example of FIG. 3A. As the slow (reference) delay line is shared between the positive (first fast delay line) and the negative (second fast delay line) half circuits, jitter and other errors associated with it cancel out.

Both stop signals may have the same polarity, and the time duration that the TPWQ is digitizing is the difference between the stop_p and stop_n signals. As the difference is not always positive (stop_n may, or may not come before stop_p), it is not possible to measure the difference directly. Instead, both are independently measured against the clock (start) signal and the final result is obtained by taking the difference of these two measurement results.

The sampler comprises a first sampler 204$a$ with a first plurality of clocked buffers 308. Each clocked buffer 308 has an input connected to the output of a corresponding first delay element 302 in the first fast delay line 200$a$, and a clock input connected to the output of a corresponding second delay element 306 of the slow delay line 202. A second sampler 204$b$ has a first plurality of clocked buffers 308, where each clocked buffer has an input corrected to the output of a corresponding first delay element 302 in the second fast delay line 200$b$, and a clock input connected to the output of a corresponding second delay element 306 of the slow delay line 202.

The resampler comprises a first resampler 206$a$ having an input to accept the first plurality of clocked buffer outputs from the first sampler 204$a$. The first resampler 206$a$ has an output 310$a$ to supply a first plurality of TDC output bits representing a time delay between the first stop signal and the first period of the clock signal, as explained above in the description of FIG. 3A. A second resampler 206$b$ has an input to accept the first plurality of clocked buffer outputs from the second sampler 204b, and an output 310b to supply a first plurality of differential TDC output bits representing a time delay between the parallel first stop signal and the first period of the clock signal.

A subtractor 1002 has an inputs on lines 1000a and 1000b to accept, respectively, the TDC output bits and the differential TDC output bits, and an output on line 312 (Dout) to supply a difference between the TDC output bits and the differential TDC output hits. As shown with phantom lines, alternatively, the TDC output bits are processed by thermometer-to-binary blocks 208a and 200h, and the differential binary codes subtracted.

Figure 11:
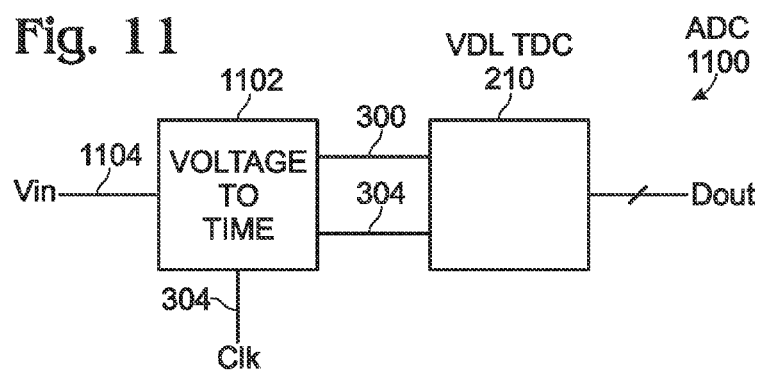
FIG. 11 is a block diagram of a TPWQ analog-to-digital converter (ADC).

FIG. 11 is a block diagram of a TPWQ analog-to-digital converter (ADC). The ADC 1100 comprises a voltage-to-time circuit 1102 having an input on line 1104 to accept an analog voltage and an output on line 300 to supply a stop signal having a time delay corresponding to a sampled analog voltage level. In this aspect, the voltage-to-time circuit 1102 accepts a clock signal on line 304, which is passed on to the TPWQ 210. The voltage-to-time circuit 1102 first samples, and then converts the incoming signal voltage into the time domain by means of pulse position modulation. Once the analog information is in the form of a pulse edge position, it is digitized with the TPWQ 210.

Details of the TPWQ are explained in the description of FIG. 3A, and are not repeated here in the interest of brevity. Although a single-ended stop signal is shown in the block diagram, it should be understood that ADC could also be enabled with the differential TPWQ of FIG. 10. In the example shown, the resampler supplies a first plurality of TDC output hits representing a time delay between the stop signal on line 300 and a first period of the clock signal on line 304, which corresponds to the analog input signal voltage on line 1104. The TDC output bits are valid and accurate regardless of a rate at which the analog input signal voltage is sampled.

Figure 12:
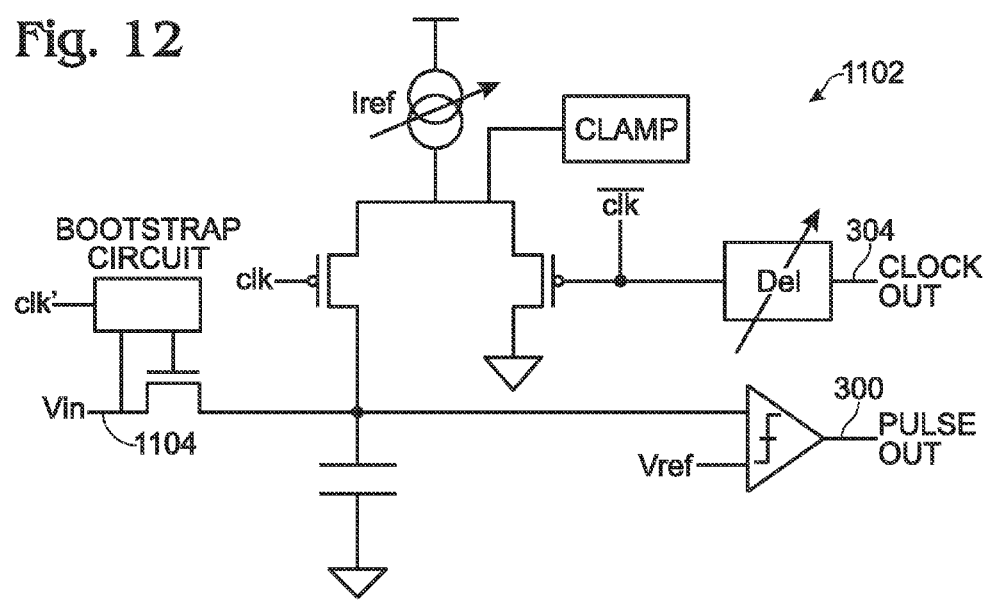
FIG. 12 is a schematic block diagram of an exemplary voltage-to-time circuit.

FIG. 12 is a schematic block diagram of an exemplary voltage-to-time circuit. In a manner similar to a well-known single-slope ADC, by adjusting the ramp rate through the control of the discharge current, it is possible to make a trade-off between the conversion time (i.e. sampling rate) and the dynamic range. The voltage-to-time converter circuit can be modeled with the transfer function Tout=Kv*Vin, where Kv is a conversion factor between voltage and time and has the unit of seconds per volt [s/V]. In this circuit the numerical value of the conversion, factor is determined by the size of the capacitor and the value of the discharge current.

If used in an ADC, the ADC would have an input voltage range between some Vmin and Vmax. For simplicity it can assumed that Vmin is zero. According to the transfer function there is a maximum ramp duration Tmax=Kv*Vmax. If the ADC operates at sample rate fs=1/Ts, the maximum possible Tmax<Ts. Otherwise, the longest possible ramp cannot be completed before the ADC starts to process the next sample. In practice, when the sample-and-hold operation is also considered, the maximum time available for the ramp is about Ts/2.

If the TPWQ that follows the voltage-to-time circuit has a fixed time resolution with a corresponding LSB size Tlsb, the number of digital levels is Tmax/Tlsb. For instance, if this number is 128, the TDC (and the ADC) has a resolution of 7 bits. An increase (or decrease) in the resolution can be done by changing Tlsb, but that may not be always possible. On the other hand, if there is time available, Tmax may be increased. Thus, changes in Tmax may be used to realize an ADC that has variable resolution. For example, at the maximum sampling rate the ADC has a certain resolution that can be increased by lowering the sampling rate while simultaneously reducing the discharge rate in the voltage-to-time circuit.

Figure 13:
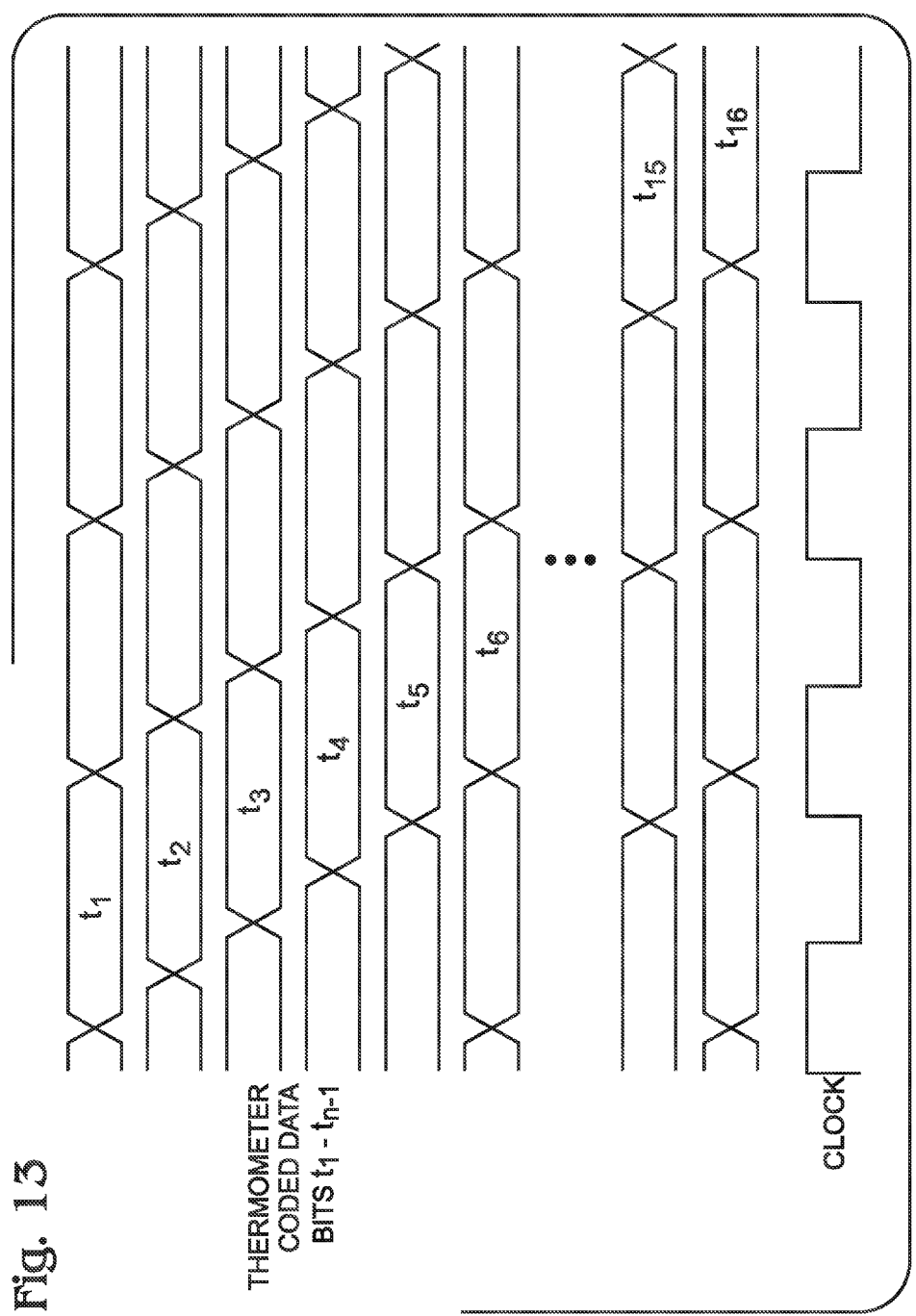
FIG. 13 is a timing diagram depicting a waveform associated with the TDC output (thermometer coded data) bits.

FIG. 13 is a timing diagram depicting a waveform associated with the TDC output (thermometer coded data) bits. The TPWQ described herein is able to operate at rates Tclk<Tdel (see FIG. 3B). As such, more than one pair of pulses can travel simultaneously along the delay lines without corrupting one another. The use of the resampler, added to the output of the sampler, solves two problems. It prevents metastability when the data bit changes are close to the capturing clock edge, and it correctly realigns the different data bits that belong to one signal sample.

FIG. 14 is a flowchart illustrating a method for converting a time sensitive signal to a digital value. Alternatively, this method is referred to as "Pulse Train Quantization, "Traveling Pulse Wave Quantization", or "Pulse Position Train Quantization". Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps, and can be enabled with the circuitry described above. The method starts at Step 1400.

Step 1402 accepts a clock signal. Step 1404 accepts a first stop signal at a non-predetermined time after the acceptance of a first period of the clock signal. Step 1406 delays the first stop signal by a first time delay, a first plurality of times, to create a delayed first stop signal. Step 1408 delays the clock signal by a second time delay, a first plurality of times, to create a delayed clock signal first period. Each second time delay is associated with a corresponding first time delay, and the second time delay is greater than the first time delay.

Step 1410 counts the number of first time delays. When the delayed first stop signal occurs before the delayed clock signal first period, Step 1412 stops the count. Step 1414 converts the count into a digital value. The digital value is accurate and uncorrupted, regardless of the duration in delay between the first stop signal and a second stop signal accepted after the first stop signal.

Actually, either the first time delays or second time delays can be counted in Step 1410, as the result is the same. When the crossing happens Td+k*T1=k*T2, or Td=k*(T2−T1), where Td is the time to be measured, k is the number of time delays, and T2−T1 is the difference of slow (second) delay and fast (first) delay. Alternatively stated, Step 1410 counts the number of first time delays associated with the first stop signal while simultaneously counting the number of first time delays associated with the second stop signal.

In one aspect, counting the number of delays in Step 1410 includes substeps. Step 1410a creates a tally of first (or second) time delays. Step 1410b delays the recordation of each tally in response to the order in which the tally occurs, where an initial tally is assigned a longer delay than a subsequent tally.

In another aspect for use as an ADC, Step 1401a accepts an analog signal having a voltage, and Step 1401b converts the analog signal into the first stop signal. Then, converting the count into the digital value in Step 1414 includes converting the count into a digital value representing the analog signal voltage.

A TPWQ, an ADC based on a TPWQ, and an associated method of digitizing time delays have been provided. Examples of particular circuit components and hardware units have been presented to illustrate the invention. However, the invention is not limited to merely these examples. Other variations and embodiments of the invention will occur to those skilled in the art.

I claim:

1. A Traveling Pulse Wave Quantizer (TPWQ) comprising:
   a fast delay line having an input to accept a first stop signal followed by a second stop signal, the fast delay line comprising a first plurality of first delay elements connected in series with an output between each first delay element, where each first delay element has a first time delay;
   a slow delay line having an input to accept a clock signal and comprising a first plurality of second delay elements connected in series with an output between each second delay element, where each second delay element has a second time delay greater than the first time delay;
   a sampler comprising a first plurality of clocked buffers connected in series with a sample output between each clocked buffer, each clocked buffer having a signal input connected to the output of a corresponding first delay element, and a clock input connected to the output of a corresponding second delay element; and,
   a resampler having an input to accept the first plurality of clocked buffer outputs, and an output to supply a first plurality of time-to-digital converter (TDC) output bits representing a time delay between the first stop signal and a first period of the first clock signal, regardless of a duration in delay between the first stop signal and the second stop signal.

2. The TPWQ of claim 1 wherein the resampler comprises a first plurality of cells ordered in an array, each cell having a signal input connected to a corresponding sample output, and a TDC output bit delayed with respect to the order of the cell in the array.

3. The TPWQ of claim 2 wherein each resampler cell comprises:
   a clocked buffer having an input connected to a corresponding sample output, an input to accept a clock signal, and an output to supply a resampled signal;
   a delay circuit having an input to accept the resampled signal, and an output to supply a delayed resampled signal as a TDC output bit.

4. The TPWQ of claim 3 wherein the clocked buffer supplies a resampled signal responsive to an edge of the clock signal selected from a group consisting of a positive edge and a negative edge.

5. The TPWQ of claim 3 wherein the delay circuit is a programmable delay circuit having an input to accept a delay control signal, and an output to supply the TDC output bit with a delay duration responsive to the delay control signal.

6. The TPWQ of claim 2 wherein each resampler cell comprises:
   a first clocked buffer having an input connected to a corresponding sample output, an input to accept a clock signal, and an output to supply a first resampled signal responsive to a positive edge of the clock signal;
   a second clocked buffer having an input connected to the corresponding sample output, an input to accept the clock signal, and an output to supply a second resampled signal responsive to a negative edge of the clock signal;
   a multiplexer (MUX) having inputs accepting the first and second resampled signals, a MUX control input, and an output to supply a resampled signal selected in response to the MUX control signal; and,
   a delay circuit having an input to accept the selected resampled signal, and an output to supply a delayed resampled signal as a TDC output bit.

7. The TPWQ of claim 6 wherein the delay circuit is a programmable delay circuit having an input to accept a delay control signal, and an output to supply the TDC output bit with a delay duration responsive to the delay control signal.

8. The TPWQ of claim 7 further comprising:
   an incrementing device with a first plurality of control word outputs, each control word output corresponding to a resampler cell, the incrementing device supplying a MUX control signal that periodically changes in response to the order of the cell in the array, and a delay control signal that changes the delay duration in responsive to the order of the cell in the array.

9. The TPWQ of claim 8 wherein the incrementing device comprises a first plurality of summers connected in series, each summer having an output connected to supply a control word to corresponding resampler cell and a first input to accept a control word from an adjacent summer, and each summer having a second input to accept an augmentation term modifying the control word accepted at the first input.

10. The TPWQ of claim 1 wherein the fast delay line comprises:
    a first fast delay line having an input to accept the first stop signal, with a first plurality of first delay elements connected in series;
    a second fast delay line having an input to accept a parallel first stop signal, nominally accepted at the same time as the first stop signal, the second fast delay line having a first plurality of first delay elements connected in series;
    wherein the sampler comprises:
      a first sampler with a first plurality of clocked buffers, where each clocked buffer has an input connected to the output of a corresponding first delay element in the first fast delay line, and a clock input connected to the output of a corresponding second delay element of the slow delay line;
      a second sampler with a first plurality of clocked buffers, where each clocked buffer has an input corrected to the output of a corresponding first delay element in the second fast delay line, and a clock input connected to the output of a corresponding second delay element of the slow delay line;
    wherein the resampler comprises:
      a first resampler having an input to accept the first plurality of clocked buffer outputs from the first sampler, and an output to supply a first plurality of TDC output hits representing a time delay between the first stop signal and a first period of the clock signal,
      a second resampler having an input to accept the first plurality of clocked buffer outputs from the second sampler, and an output to supply a first plurality of differential TDC output hits representing a time delay between the parallel first stop signal and the first period of the clock signal; and,
    a subtractor having an input to accept the TDC output hits and the differential TDC output hits, and an output to supply a difference between the TDC output hits and the differential TDC output hits.

11. A Traveling Pulse Wave Quantizer (TPWQ) analog-to-digital converter (ADC) comprising:
    a voltage-to-time circuit having an input to accept an analog voltage and an output to supply a stop signal having a time delay corresponding to a sampled analog voltage level;
    a fast delay line having an input to accept the stop signal and comprising a first plurality of first delay elements connected in series with an output between each first delay element, where each first delay element has a first time delay;

a slow delay line having an input to accept a clock signal and comprising a first plurality of second delay elements connected in series with an output between each second delay element, where each second delay element has a second time delay, greater than the first time delay;

a sampler comprising a first plurality of clocked buffers connected in series with a sample output between each clocked buffer, each clocked buffer having a signal input connected to the output of a corresponding first delay element, and a clock input connected to the output of a corresponding second delay element; and, a resampler having an input to accept the first plurality of clocked buffer outputs, and an output to supply a first plurality of time-to-digital converter (TDC) output bits representing a time delay between the stop signal and a first period of the clock signal, which corresponds to the analog input signal voltage, regardless of a rate at which the analog input signal voltage is sampled.

12. The ADC of claim 11 wherein the resampler comprises a first plurality of cells ordered in an array, each cell having a signal input connected to a corresponding sample output, and a TDC output bit delayed with respect to the order of the cell in the array.

13. The ADC of claim 12 wherein each resampler cell comprises:
a clocked buffer having an input connected to a corresponding sample output, an input to accept a clock signal, and an output to supply a resampled signal;
a delay circuit having an input to accept the resampled signal, and an output to supply a delayed resampled signal as a TDC output bit.

14. The ADC of claim 13 wherein the clocked buffer supplies a resampled signal responsive to an edge of the clock signal selected from a group consisting of a positive edge and a negative edge.

15. The ADC of claim 13 wherein the delay circuit is a programmable delay circuit having an input to accept a delay control signal, and an output to supply the TDC output bit with a delay duration responsive to the delay control signal.

16. The ADC of claim 12 wherein each resampler cell comprises:
a first clocked buffer having an input connected to a corresponding sample output, an input to accept a clock signal, and an output to supply a first resampled signal responsive to a positive edge of the clock signal;
a second clocked buffer having an input connected to the corresponding sample output, an input to accept the clock signal, and an output to supply a second resampled signal responsive to a negative edge of the clock signal;
a multiplexer (MUX) having inputs accepting the first and second resampled signals, a MUX control input, and an output to supply a resampled signal selected in response to the MUX control signal; and,
a delay circuit having an input to accept the selected resampled signal, and an output to supply a delayed resampled signal as a TDC output bit.

17. A method for converting a time sensitive signal to a digital value, the method comprising:
accepting a clock signal;
accepting a first stop signal at a non-predetermined time after the acceptance of a first period of the clock signal;
delaying the first stop signal by a first time delay, a first plurality of times, to create a delayed first stop signal;
delaying the clock signal by a second time delay, a first plurality of times, to create a delayed clock signal first period, where each second time delay is associated with a corresponding first time delay, and the second time delay is greater than the first time delay;
counting the number of first time delays;
when the delayed first stop signal occurs before the delayed clock signal first period, stopping the count; and,
converting the count into a digital value, regardless of a duration in delay between the first stop signal and a second stop signal accepted after the first stop signal.

18. The method of claim 17 wherein counting the number of first time delays includes counting the number of first time delays associated with the first stop signal while simultaneously counting the number of first time delays associated with the second stop signal.

19. The method of claim 17 wherein counting the number of first time delays includes:
creating a tally of first time delays; and,
delaying the recordation of each tally in response to the order in which the tally occurs, where an initial tally is assigned a longer delay than a subsequent tally.

20. The method of claim 17 further comprising:
accepting an analog signal having a voltage;
converting the analog signal into the first stop signal; and,
wherein converting the count into the digital value includes converting the count into a digital value representing the analog signal voltage.

* * * * *

UNITED STATES PATENT AND TRADEMARK OFFICE
CERTIFICATE OF CORRECTION

| | | |
|---|---|---|
| PATENT NO. | : 9,098,072 B1 | Page 1 of 1 |
| APPLICATION NO. | : 14/681206 | |
| DATED | : August 4, 2015 | |
| INVENTOR(S) | : Mikko Waltari | |

It is certified that error appears in the above-identified patent and that said Letters Patent is hereby corrected as shown below:

Column 11, lines 22-26, Claim 12, should read

12. The ADC of claim 11 wherein the resampler comprises a first plurality of cells ordered in an array, each cell having a signal input connected to a corresponding sample output, and a TDC output bit delayed with respect to the order of the cell in the array.

Signed and Sealed this
Twelfth Day of January, 2016

Michelle K. Lee
*Director of the United States Patent and Trademark Office*